(12) United States Patent
Xie et al.

(10) Patent No.: US 12,444,653 B2
(45) Date of Patent: Oct. 14, 2025

(54) BURIED POWER RAIL AT TIGHT CELL-TO-CELL SPACE

(71) Applicant: INTERNATIONAL BUSINESS MACHINES CORPORATION, Armonk, NY (US)

(72) Inventors: Ruilong Xie, Niskayuna, NY (US); Stuart Sieg, Albany, NY (US); Somnath Ghosh, Clifton Park, NY (US); Kisik Choi, Watervliet, NY (US); Kevin Shawn Petrarca, Newburgh, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 796 days.

(21) Appl. No.: 17/545,073

(22) Filed: Dec. 8, 2021

(65) Prior Publication Data
US 2023/0178433 A1    Jun. 8, 2023

(51) Int. Cl.
*H01L 21/768* (2006.01)
*H01L 21/74* (2006.01)
(Continued)

(52) U.S. Cl.
CPC ...... *H01L 21/76898* (2013.01); *H01L 23/481* (2013.01); *H10D 84/83* (2025.01)

(58) Field of Classification Search
CPC ............. H01L 21/76898; H01L 23/481; H01L 23/5286; H01L 21/76895; H01L 21/743;
(Continued)

(56) References Cited

U.S. PATENT DOCUMENTS 9,570,395 B1    2/2017 Sengupta et al.
10,475,692 B2  11/2019 Licausi et al.
(Continued)

FOREIGN PATENT DOCUMENTS

CN       113343631 A     9/2021
DE   102020129842 A1     9/2021
(Continued)

OTHER PUBLICATIONS

Office Action for TW 111128063 dated Jul. 24, 2023 ( 7 pages).
(Continued)

*Primary Examiner* — Herve-Louis Y Assouman
(74) *Attorney, Agent, or Firm* — Tutunjian & Bitetto, P.C.; Samuel Waldbaum (57) ABSTRACT

A semiconductor device includes a first buried power rail (BPR) disposed through etch stop layers and a second BPR disposed in direct contact with the first BPR, where the first BPR has a larger critical dimension (CD) than the second BPR. A bottom surface of the first BPR directly contacts a via-to buried power rail (VBPR) contact. Source/drain contacts (CA) are disposed adjacent the VBPR contact and source/drain regions collectively defining middle-of-line (MOL) components. Back-end-of-line (BEOL) components are then constructed adjacent to the MOL components, and the MOL and BEOL components bond to a carrier wafer. The second BPR is then constructed on the carrier wafer.

14 Claims, 12 Drawing Sheets

(51) Int. Cl.
*H01L 23/48* (2006.01)
*H01L 23/528* (2006.01)
*H01L 23/535* (2006.01)
*H10D 84/01* (2025.01)
*H10D 84/03* (2025.01)
*H10D 84/83* (2025.01)

(58) Field of Classification Search
CPC .. H01L 23/535; H10D 84/83; H10D 84/0158; H10D 84/834; H10D 84/0149; H10D 84/038
See application file for complete search history.

(56) References Cited

U.S. PATENT DOCUMENTS

| | | | |
|---|---|---|---|
| 10,586,765 | B2 | 3/2020 | Smith et al. |
| 10,636,739 | B2 | 4/2020 | Beyne et al. |
| 10,700,207 | B2 | 6/2020 | Chen et al. |
| 10,872,818 | B2 | 12/2020 | Chiang et al. |
| 10,985,057 | B2 | 4/2021 | Jourdain et al. |
| 10,998,238 | B2 | 5/2021 | Ching et al. |
| 11,055,469 | B2 | 7/2021 | Peng et al. |
| 2006/0145538 | A1 | 7/2006 | Proefrock et al. |
| 2018/0374791 | A1 | 12/2018 | Smith et al. |
| 2020/0105671 | A1 | 4/2020 | Lai et al. |
| 2020/0373240 | A1 | 11/2020 | Vadi |
| 2020/0373331 | A1* | 11/2020 | Kim ............... H10D 86/201 |
| 2020/0411436 | A1 | 12/2020 | Xie et al. |
| 2021/0028059 | A1 | 1/2021 | Chan et al. |
| 2021/0134721 | A1 | 5/2021 | Chiang et al. |
| 2021/0305381 | A1 | 9/2021 | Chiang et al. |
| 2022/0173039 | A1* | 6/2022 | Yang ............... H10D 84/907 |

FOREIGN PATENT DOCUMENTS

| | | |
|---|---|---|
| TW | 200637098 A | 10/2006 |
| TW | 201917893 A | 5/2019 |
| TW | 202008589 A | 2/2020 |
| TW | I734919 B | 8/2021 |

OTHER PUBLICATIONS

Response to communication pursuant to Rule 161(1) dated Jan. 15, 2025, Application No. 22818898.3, IBM Patent Reference, 7 pages.
International Search Report from PCT/IB2022/061538 dated Feb. 10, 2023. (11 pages).
Prasad et al., "Buried Power Rails and Back-side Power Grids: Arm® CPU Power Delivery Network Design Beyond 5nm", 2019 IEEE International Electron Devices Meeting (IEDM), Dec. 7-11, 2019, 04 pages.
Wang et al. "An M-Cache-Based Security Monitoring and Fault Recovery Architecture for Embedded Processor", IEEE Transactions on Very Large-Scale Integration (VLSI) Systems, Nov. 2020, pp. 2314-2327, vol. 28, Issue No. 11, DOI: 10.1109/TVLSI.2020.3021533.

* cited by examiner

BURIED POWER RAIL AT TIGHT CELL-TO-CELL SPACE

BACKGROUND

The present invention relates generally to semiconductor devices, and more specifically, to forming a buried power rail at a tight cell-to-cell space.

Semiconductor devices are used in a variety of electronic applications, such as personal computers, cell phones, digital cameras, and other electronic equipment. Semiconductor devices are usually fabricated by sequentially depositing insulating or dielectric layers, conductive layers, and semiconductive layers of material over a semiconductor substrate, and patterning the various material layers using lithography to form circuit components and elements thereon.

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node.

With the increased demands for miniaturization, higher speed, greater bandwidth, lower power consumption, and lower latency, chip layout has become more complicated and difficult to achieve in the production of semiconductor dies. For example, the routing area has decreased.

SUMMARY

In accordance with an embodiment, a semiconductor device is provided. The semiconductor device includes a first buried power rail (BPR) disposed through etch stop layers and a second BPR disposed in direct contact with the first BPR, wherein the first BPR has a larger critical dimension (CD) than the second BPR.

In accordance with another embodiment, a semiconductor device is provided. The semiconductor device includes source/drain contacts (CA) disposed adjacent via-to buried power rail (VBPR) contacts and source/drain regions collectively defining middle-of-line (MOL) components and a buried power rail (BPR) disposed through etch stop layers such that the BPR directly contacts a VBPR contact of the VBPR contacts.

In accordance with yet another embodiment, a method is provided for forming a semiconductor device. The method includes forming a sacrificial layer over a substrate, forming a semiconductor layer and nanosheet stacks over the sacrificial layer, forming BPR openings extending through the sacrificial layer into the substrate between complementary metal oxide semiconductor (CMOS) cell boundaries, selectively etching portions of the sacrificial layer and forming inner spacers, forming a recessed sacrificial BPR in the BPR openings, constructing a first BPR over the recessed sacrificial BPR, constructing middle-of-line (MOL) components and back-end-of-line (BEOL) components, and bonding to a carrier wafer, flipping the carrier wafer and thinning down the substrate, removing the recessed sacrificial BPR to form a backside power rail trench to expose a dielectric liner of the first BPR, isotropically etching the substrate to enlarge the backside power rail trench, and forming a second BPR over and in direct contact with an exposed section of the first BPR.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for forming a replacement buried power rail (BPR) from a backside of a wafer.

Fin-based active devices, primarily transistors, are extensively applied for the production of standard cells and other active device configurations processed in the front-end-of-line (FEOL) part of the integrated circuit fabrication process, and include finFETs, as well as more recent devices based on nano-wires or nano-sheets. An example technology involves the use of buried interconnect rails in the FEOL. Buried power rails (BPRs) can directly connect the transistors in the FEOL to a power delivery network located entirely on the back side of an integrated circuit chip. In particular, the source or drain area of a number of transistors are directly connected to a buried rail. The current practice for realizing this configuration is to produce an interconnect via to the buried rail, and to couple the interconnect via to the source or drain area through a local interconnect that is part of the source/drain contact level of the chip, also referred to as the "middle end of line," which is a transition between the active devices in the FEOL, and the interconnect levels (M1, M2, etc.,) in the back-end-of-line (BEOL).

Some implementations of this approach have a number of drawbacks. As the rails are buried underneath the active devices, the size of the buried power rail (BPR) is limited by the cell-to-cell space between two nearby active regions. As cell height scales down, so does the cell-to-cell space, the buried power rail size decreases, and its resistance increases, which degrades the circuit performance.

Embodiments in accordance with the present invention provide a method and structure of forming a replacement BPR from the backside of the wafer. In one implementation, a two-stage BPR is created where an upper stage is connected to a source/drain region through a via-to buried power rail (VBPR) contact and a lower stage connects to a backside power delivery network (BSPDN) through a backside nano through-Si-via (nTSV). The lower stage BPR has a larger critical dimension (CD) than the upper BPR and the lower stage BPR is stopped over a dielectric etch stop layer.

Examples of semiconductor materials that can be used in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
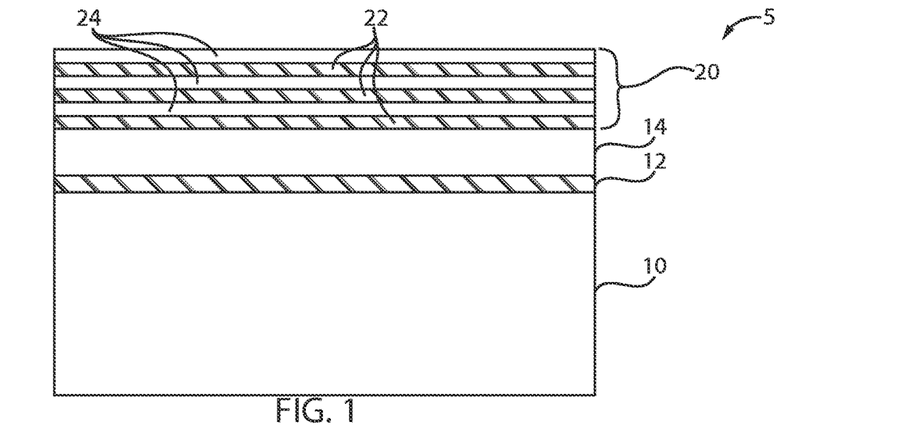
FIG. 1 is a cross-sectional view of a semiconductor structure where a nanosheet structure is formed over a substrate, in accordance with an embodiment of the present invention.

FIG. 1 is a cross-sectional view of a semiconductor structure where a nanosheet structure is formed over a substrate, in accordance with an embodiment of the present invention.

In various example embodiments, a semiconductor structure 5 includes a semiconductor substrate 10. A sacrificial layer 12 is deposited over the substrate 10. The sacrificial layer 12 can be, e.g., a silicon germanium (SiGe) layer. A semiconductor layer 14 can be deposited over the sacrificial layer 12. A nanosheet structure 20 is then deposited over the semiconductor layer 14. The nanosheet structure 20 can include, e.g., alternating layers of a first semiconductor material 22 and a second semiconductor material 24. The first semiconductor material 22 can be, e.g., silicon germanium (SiGe) and the second semiconductor material 24 can be, e.g., silicon (Si).

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

The semiconductor layer 14 can be, e.g., Si.

The sacrificial layer 12, semiconductor layer 14, nanosheet stack 20 can be formed over the substrate 10 using an epitaxy process.

Figure 2:
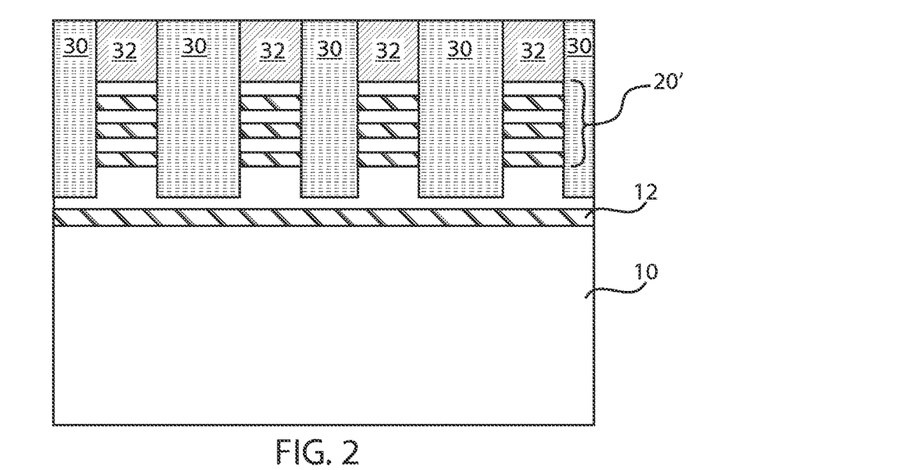
FIG. 2 is a cross-sectional view of the semiconductor structure of FIG. 1 where the nanosheet structure is patterned to form nanosheet stacks followed by dielectric fill, in accordance with an embodiment of the present invention.

FIG. 2 is a cross-sectional view of the semiconductor structure of FIG. 1 where the nanosheet structure is patterned to form nanosheet stacks followed by dielectric fill, in accordance with an embodiment of the present invention.

In various example embodiments, a hardmask 32 is deposited over the nanosheet stack, followed by nanosheet patterning using conventional litho and etch to form nanosheet stacks 20'. After that, a dielectric material is filled between the nanosheet stack (e.g., forming dielectric fill region 30).

The hardmask 32 can include a dielectric oxide or dielectric nitride. In one embodiment, the hardmask 32 includes silicon nitride. The hardmask 32 can be formed, for example, by CVD, PECVD or ALD. The thickness of the hardmask 32 can be from about 10 nm to about 50 nm, although lesser and greater thicknesses can also be employed. The dielectric fill region 30 can be oxide, SiN or combination of both, and can be formed, for example, by CVD, PECVD or ALD followed by CMP.

Figure 3:
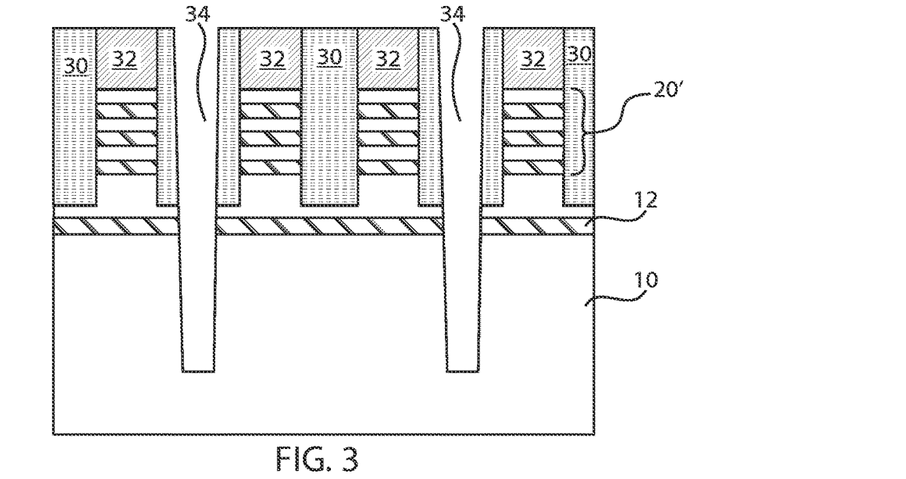
FIG. 3 is a cross-sectional view of the semiconductor structure of FIG. 2 where buried power rail (BPR) openings are formed through the dielectric fill region, semiconductor layer, sacrificial layer and into the substrate between different CMOS cells, using conventional litho and etch process, in accordance with an embodiment of the present invention.

FIG. 3 is a cross-sectional view of the semiconductor structure of FIG. 2 where buried power rail (BPR) openings are formed through the dielectric fill region 30, semiconductor layer 14, sacrificial layer 12 and into the substrate 10 between different CMOS cells, using conventional litho and etch process, in accordance with an embodiment of the present invention.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

Figure 4:
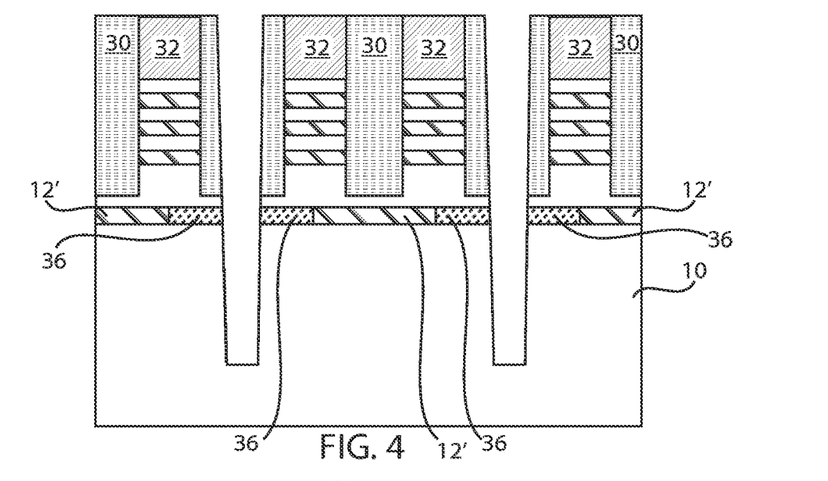
FIG. 4 is a cross-sectional view of the semiconductor structure of FIG. 3 where inner spacers are formed, in accordance with an embodiment of the present invention.

FIG. 4 is a cross-sectional view of the semiconductor structure of FIG. 3 where inner spacers are formed, in accordance with an embodiment of the present invention.

In various example embodiments, the sacrificial layer 12 is selectively etched and inner spacers 36 are formed within the etched portions. The remaining sacrificial layer portions are designated as 12'. The inner spacers 36 extend laterally under the nanosheet stacks 20'.

The inner spacers 36 can include any of one or more of SiN, SiBN, SiCN, SiOC, SiC and/or SiBCN films.

Figure 5:
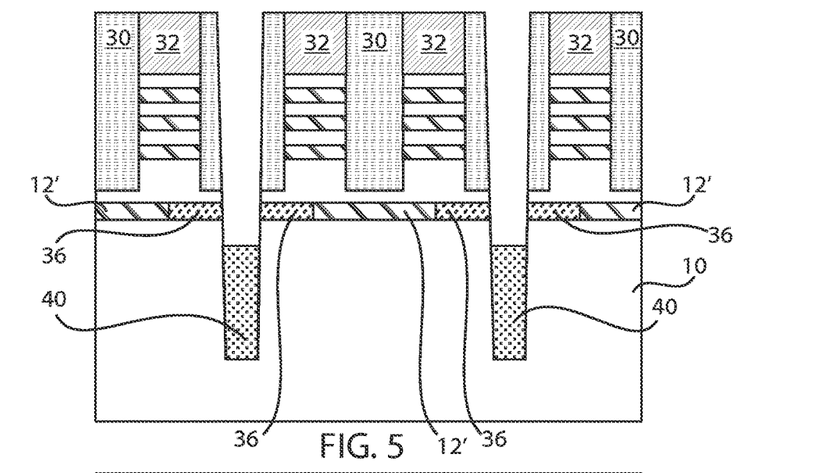
FIG. 5 is a cross-sectional view of the semiconductor structure of FIG. 4 where sacrificial BPR material, such as amorphous silicon germanium (a-SiGe) is deposited within the openings and below the inner spacers, in accordance with an embodiment of the present invention.

FIG. 5 is a cross-sectional view of the semiconductor structure of FIG. 4 where sacrificial BPR material, such as amorphous silicon germanium (a-SiGe) is deposited within the openings and below the inner spacers, in accordance with an embodiment of the present invention.

In various example embodiments, amorphous silicon germanium (a-SiGe) 40 (also referred to as a sacrificial BPR material) is deposited within the openings and below the inner spacers 36. The a-SiGe 40 is a sacrificial material subject to subsequent removal. The a-SiGe 40 can be formed by an ALD (or CVD) SiGe deposition followed by SiGe recess.

Figure 6:
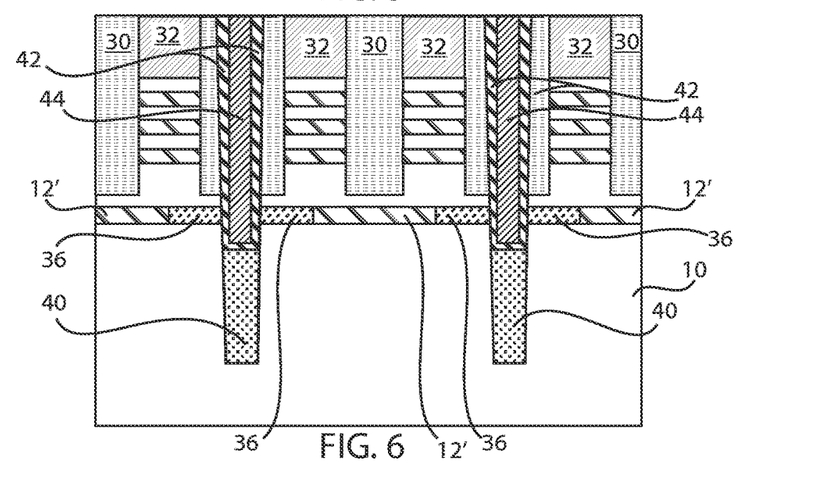
FIG. 6 is a cross-sectional view of the semiconductor structure of FIG. 5 where a dielectric liner is deposited and a metal fill takes place, in accordance with an embodiment of the present invention.

FIG. 6 is a cross-sectional view of the semiconductor structure of FIG. 5 where a dielectric liner is deposited and a metal fill takes place, in accordance with an embodiment of the present invention.

In various example embodiments, a dielectric liner 42 is deposited and a metal fill 44 takes place. The metal fill 44 is vertically aligned with the a-SiGe 40.

The metal fill 44 can be, e.g., a thin layer of adhesion layer, such as TiN or TaN, followed by high conductive metal fill, such as Co, Ru, W.

In various exemplary embodiments, the height of the dielectric liner 42 and the metal fill 44 can be reduced by CMP and/or etching. Therefore, the planarization process can be provided by CMP. Other planarization process can include grinding and polishing.

Figure 7:
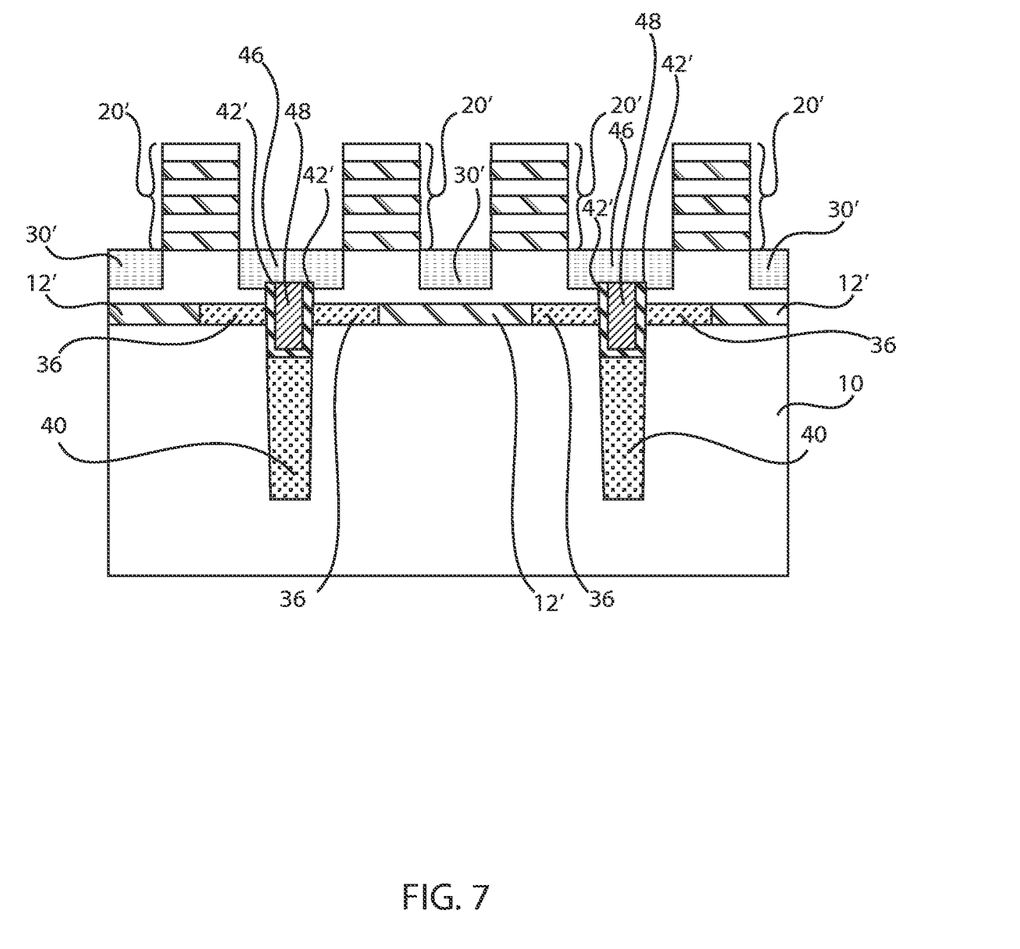
FIG. 7 is a cross-sectional view of the semiconductor structure of FIG. 6 where a metal recess is performed to form the upper portion of the buried power rail (BPR), and shallow trench isolation (STI) regions are formed to reveal the nanosheet stacks, in accordance with an embodiment of the present invention.

FIG. 7 is a cross-sectional view of the semiconductor structure of FIG. 6 where a metal recess is performed to form the upper portion of the buried power rail (BPR), and shallow trench isolation (STI) regions are formed to reveal the nanosheet stacks, in accordance with an embodiment of the present invention.

In various example embodiments, a metal recess is performed to form the upper portion of the buried power rail (BPR) 48. After that, a dielectric material 46 is deposited over and in direct contact with the BPR 48, followed by dielectric CMP and recess, to reveal the nanosheet stacks 20' and to form the shallow trench isolation (STI) regions 30'. After that, the hardmask 32 is removed.

The BPR 48 is thus formed through the inner spacers 36, which act as dielectric etch stop layers. The BPR 48 is vertically aligned with the a-SiGe 40. The BPR 48 can be referred to as the first BPR having a narrow critical dimensions (CD) and high resistance. A critical dimension is a size of a feature on an integrated circuit or transistor that impacts one or more electrical properties of the device. In particular, a critical dimension is a width or a length of a layer or process step that is performed with, e.g., photoresist, oxidation, etch, etc. Stated differently, a critical dimension is a design rule limitation that defines a minimum width of a line or a minimum space between two lines permitted in the fabrication of devices.

Figure 8:
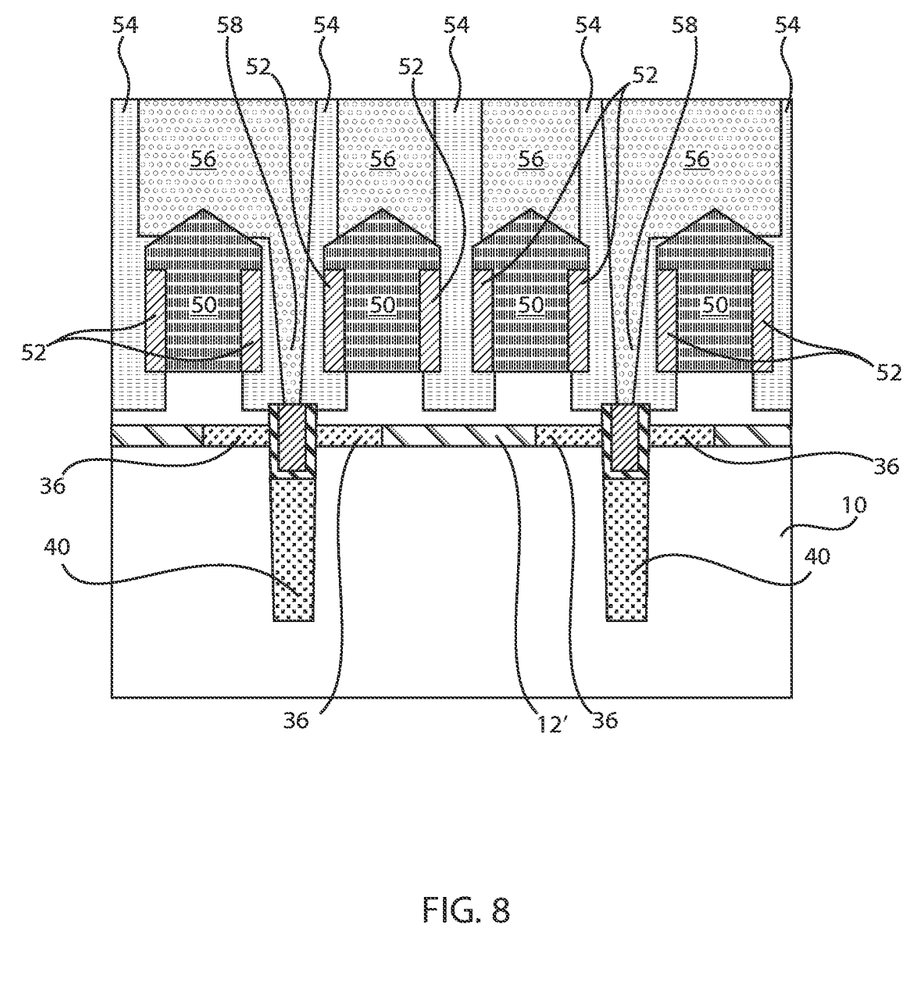
FIG. 8 is a cross-sectional view of the semiconductor structure of FIG. 7 after FEOL device fabrication and middle-of-line (MOL) processing takes place, in accordance with an embodiment of the present invention.

FIG. 8 is a cross-sectional view of the semiconductor structure of FIG. 7 after FEOL device fabrication and middle-of-line (MOL) processing takes place, in accordance with an embodiment of the present invention.

In various example embodiments, FEOL device fabrication includes dummy gate formation, spacer 52 formation, inner spacer formation, S/D epi 50 growth, ILD 54 deposition and CMP, dummy gate removal, sacrificial SiGe 22 removal, and high-k metal gate formation. The MOL processing includes, for example, constructing MOL components such as source/drain contacts (CA) 56 that are formed over the source/drain regions 50. The gate contact (CB) is formed over the gate (not shown). A via-to buried power rail (VBPR) contact 58 is formed to a top surface of the first BPR 48. The VBPR 58 is connected to S/D epi 50 through a local S/D contact 56.

The ILD 54 can be any suitable dielectric such as, for example, silicon oxide (SiO), silicon nitride (SiN), silicon oxynitride, silicon boron carbon nitride (SiBCN), silicon oxygen carbon nitride (SiOCN), silicon oxygen carbon (SiOC), silicon carbon nitride (SiCN), hydrogenated oxidized silicon carbon (SiCOH), or any suitable combination of those materials. In one example, the ILD 54 can be a low-k oxide.

The CA/CB/VBPR contacts 56, 58 can include a silicide liner, such as Ti, Ni, NiPt, etc., a thin adhesion metal layer, such as TiN, TaN, and high conductive metal fill, such as W, Co, or Ru.

In various exemplary embodiments, the height of the contacts can be reduced by CMP and/or etching. Therefore, the planarization process can be provided by CMP. Other planarization process can include grinding and polishing.

Figure 9:
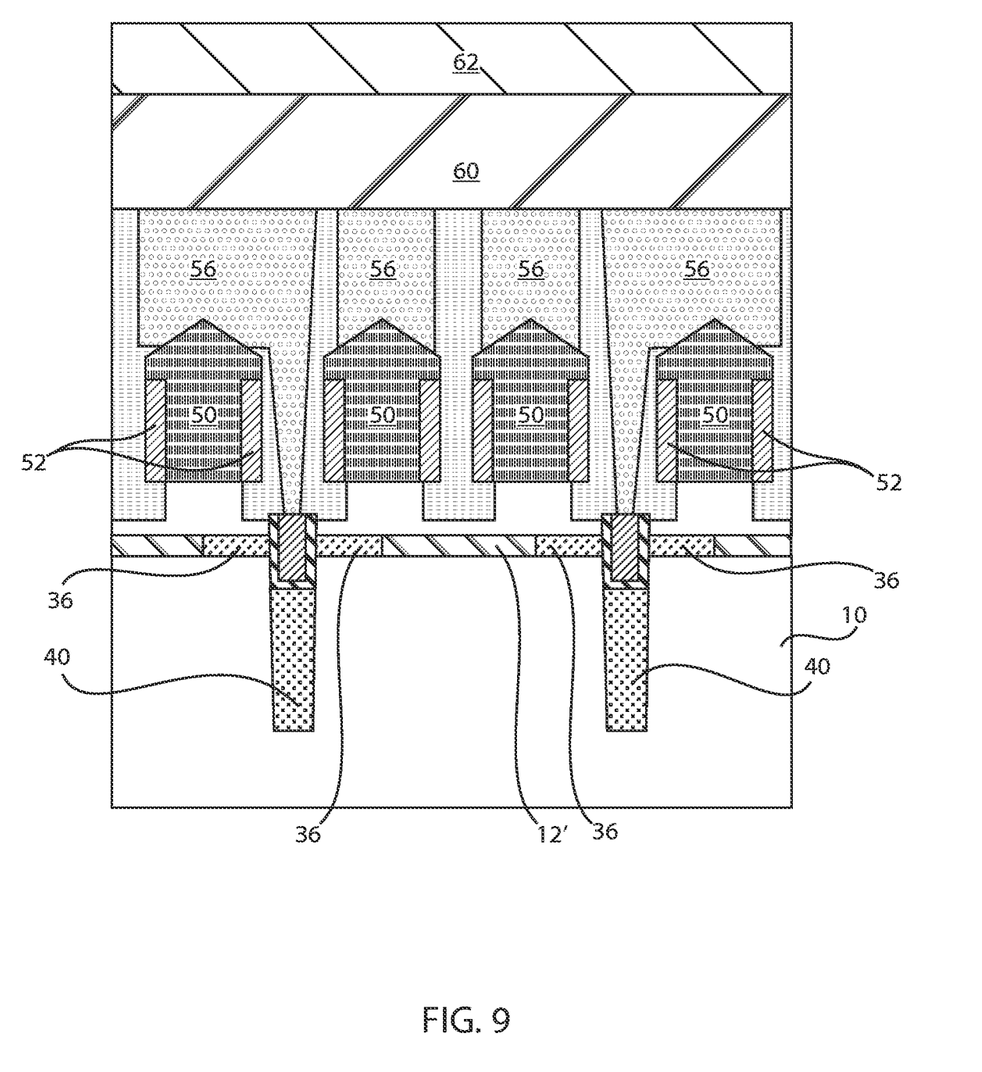
FIG. 9 is a cross-sectional view of the semiconductor structure of FIG. 8 where back-end-of-line (BEOL) processing takes place and a carrier wafer is bonded, in accordance with an embodiment of the present invention.

FIG. 9 is a cross-sectional view of the semiconductor structure of FIG. 8 where back-end-of-line (BEOL) processing takes place and a carrier wafer is bonded, in accordance with an embodiment of the present invention.

In various example embodiments, back-end-of-line (BEOL) components 60 can be formed over the MOL components or contacts, and a carrier wafer 62 is bonded over a top surface of the BEOL components 60 thereon. The MOL and BEOL components can also be referred to as MOL and BEOL interconnect structures, respectively.

Figure 10:
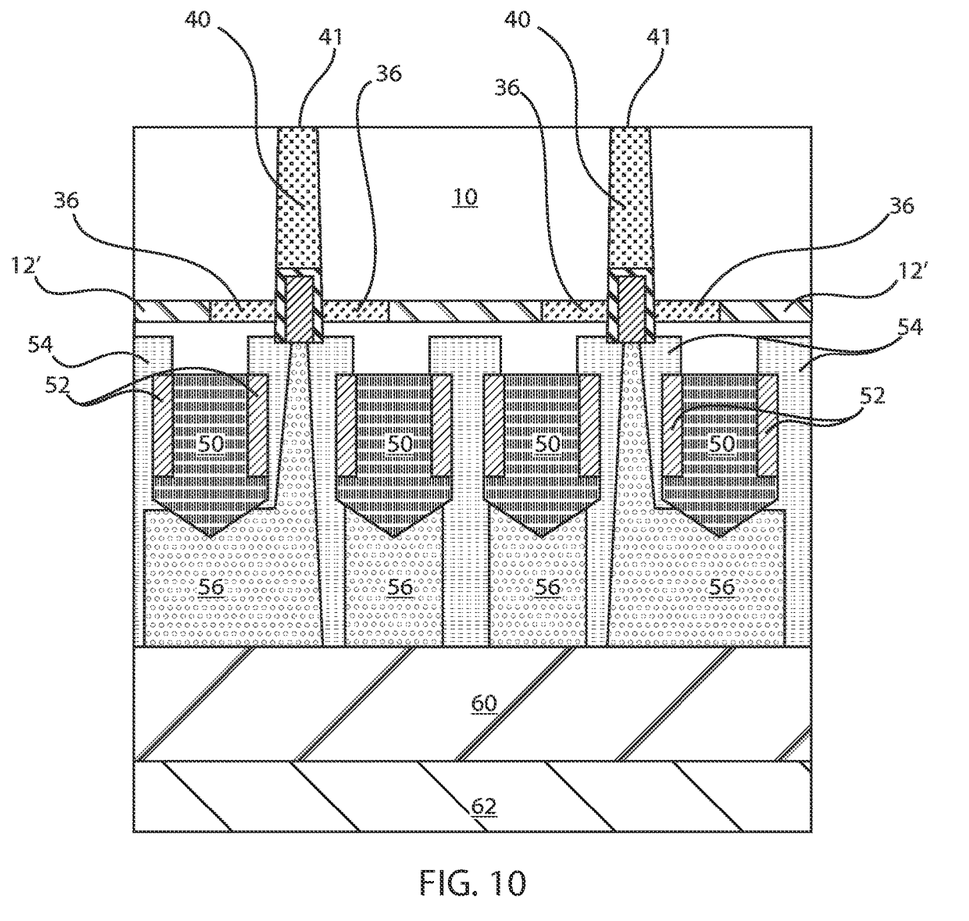
FIG. 10 is a cross-sectional view of the semiconductor structure of FIG. 9 where the carrier wafer is flipped and substrate thinning takes place, in accordance with an embodiment of the present invention.

FIG. 10 is a cross-sectional view of the semiconductor structure of FIG. 9 where the carrier wafer is flipped and substrate thinning takes place, in accordance with an embodiment of the present invention.

In various example embodiments, the carrier wafer 62 is flipped and substrate thinning takes place to expose a top surface 41 of the sacrificial BPR material 40.

Figure 11:
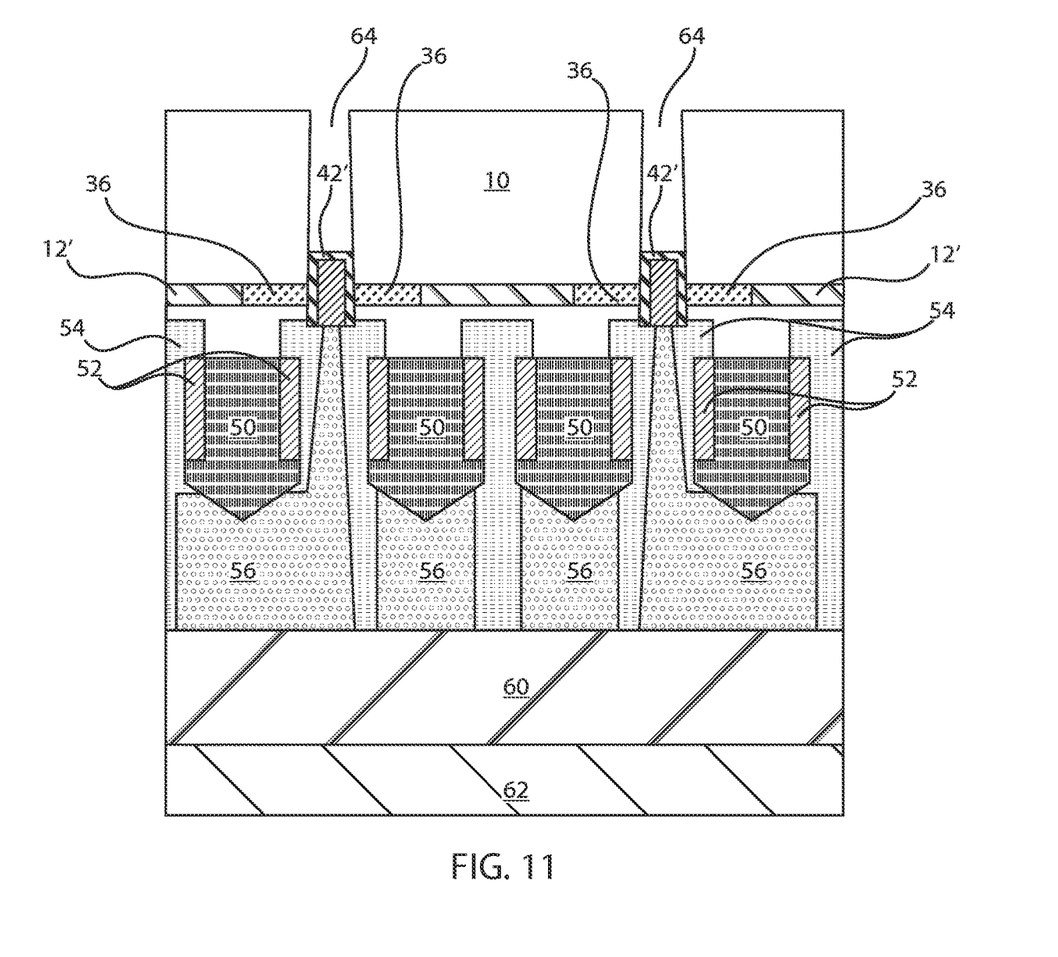
FIG. 11 is a cross-sectional view of the semiconductor structure of FIG. 10 where the a-sacrificial BPR is selectively removed to expose the buried power rail (BPR) liner, in accordance with an embodiment of the present invention.

FIG. 11 is a cross-sectional view of the semiconductor structure of FIG. 10 where the sacrificial BPR material 40 is selectively removed to expose the buried power rail (BPR) liner 42, in accordance with an embodiment of the present invention.

In various example embodiments, the sacrificial BPR material 40 is selectively removed thus creating openings 64 (or backside power rail trenches) to expose the remaining dielectric liner 42' of the first BPR 48.

Figure 12:
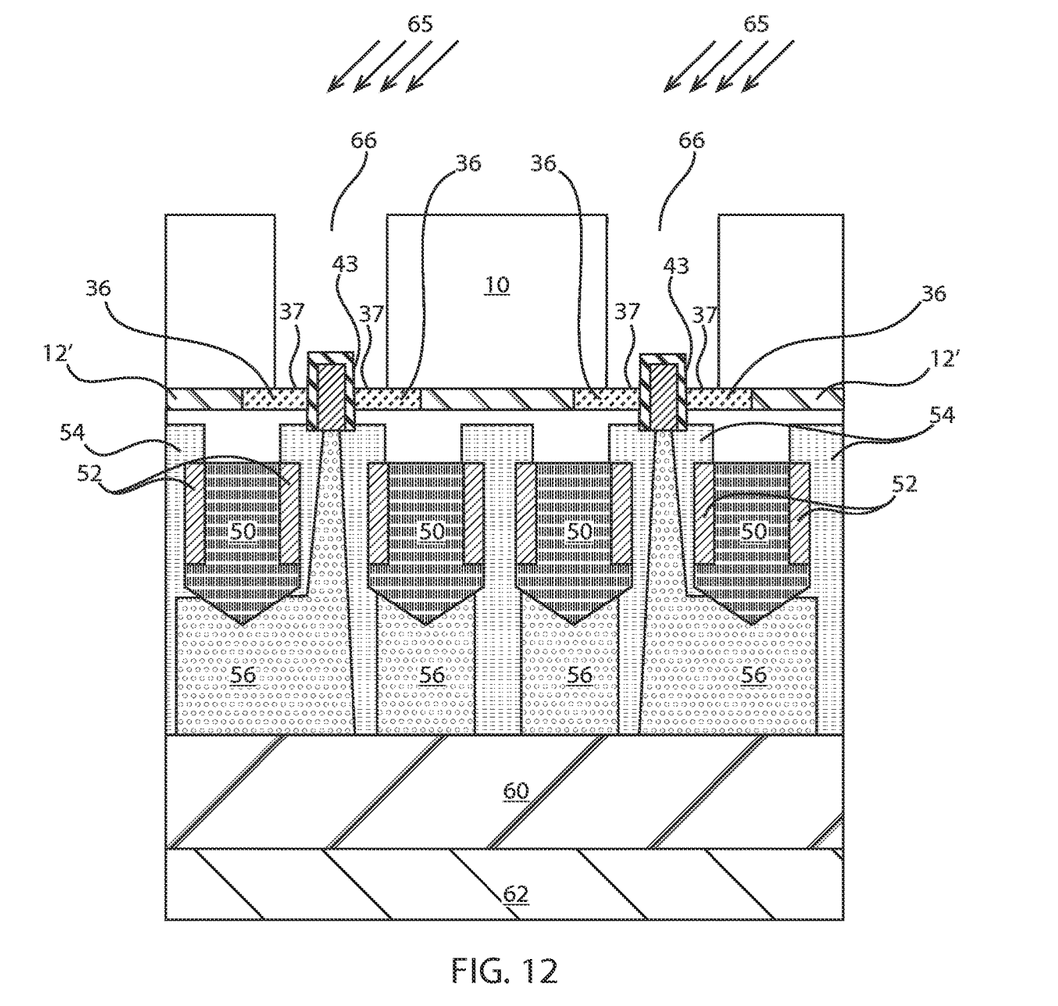
FIG. 12 is a cross-sectional view of the semiconductor structure of FIG. 11 where an isotropic silicon (Si) etch is performed to increase the critical dimension (CD), in accordance with an embodiment of the present invention.

FIG. 12 is a cross-sectional view of the semiconductor structure of FIG. 11 where an isotropic silicon (Si) etch is performed to increase the critical dimension (CD), in accordance with an embodiment of the present invention.

In various example embodiments, an isotropic silicon (Si) etch 65 is performed to increase the critical dimension (CD), designated as openings 66. The isotropic Si etch 65 exposes the top surface 37 of the inner spacers 36. Additionally, sidewalls 43 of the remaining dielectric liner 42' are exposed.

Figure 13:
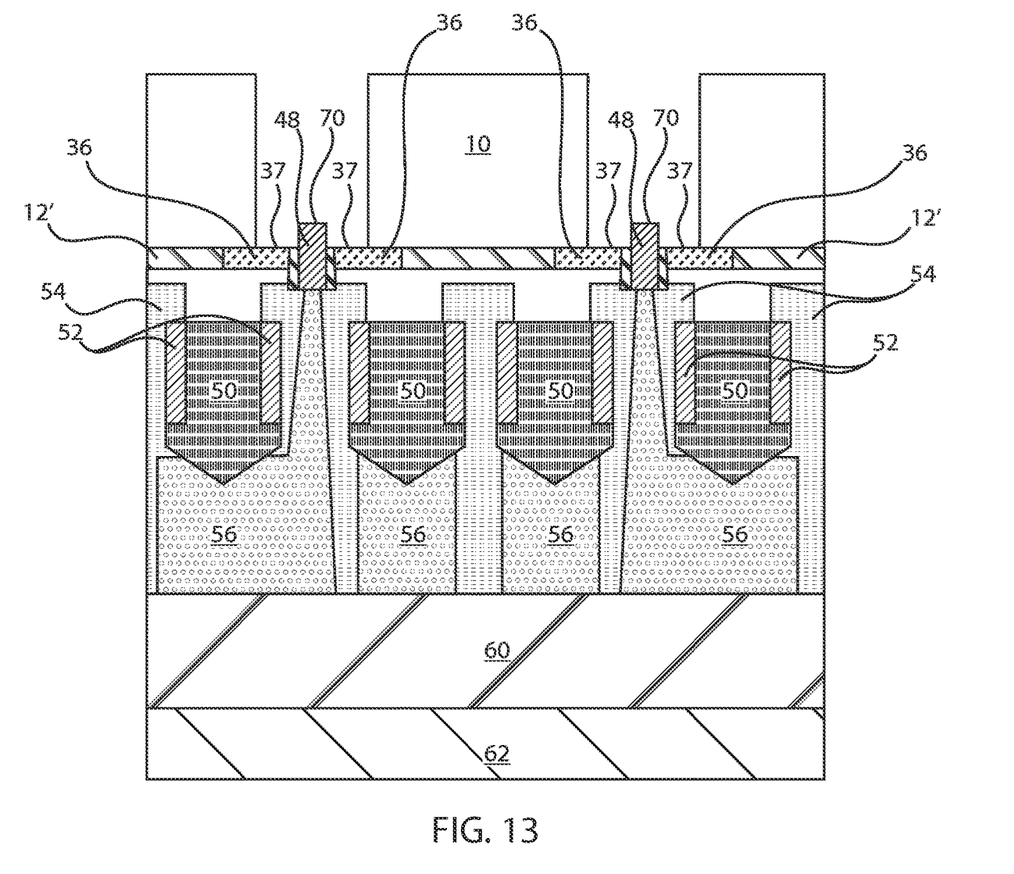
FIG. 13 is a cross-sectional view of the semiconductor structure of FIG. 12 where the exposed BPR liner is removed, in accordance with an embodiment of the present invention.

FIG. 13 is a cross-sectional view of the semiconductor structure of FIG. 12 where the exposed BPR liner is removed, in accordance with an embodiment of the present invention.

In various example embodiments, the exposed dielectric liner 42' is removed to expose a top portion or top section 70 of the BPR 48.

Figure 14:
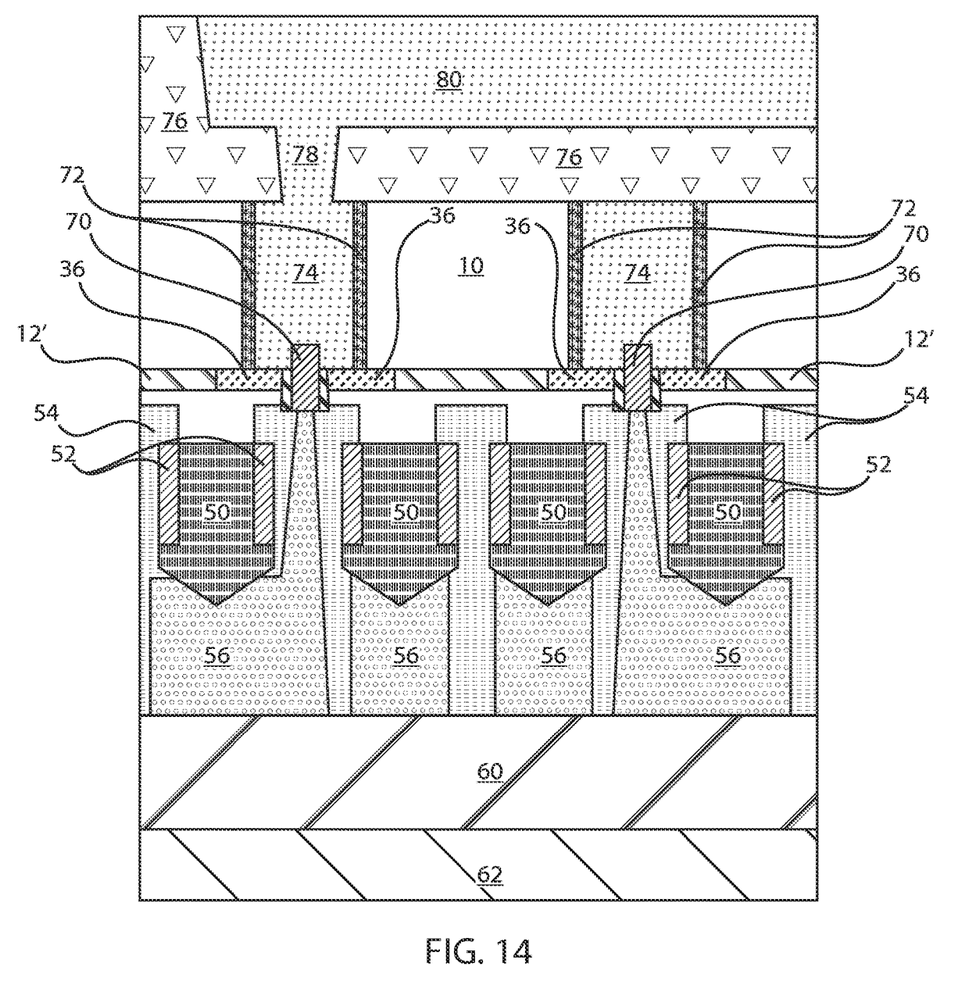
FIG. 14 is a cross-sectional view of the semiconductor structure of FIG. 13 where a second bigger BPR is formed over the first BPR and vias and metallization layers are formed, in accordance with an embodiment of the present invention.

FIG. 14 is a cross-sectional view of the semiconductor structure of FIG. 13 where a second bigger BPR is formed over the first BPR and vias and metallization layers are formed, in accordance with an embodiment of the present invention.

In various example embodiments, a second bigger BPR 74 is formed over the top section 70 of the first BPR 48. A dielectric spacer 72 is formed by conformal spacer deposition followed by anisotropic etch, followed by BPR 74 metal fill and CMP. After that, backside ILD 76 is deposited, and vias 78 and metal line layers 80 are formed therein using conventional patterning and metallization processes. The second BPR 74 directly contacts the first BPR 48. Moreover, the second BPR 74 directly contacts the top surfaces 37 of the inner spacers 36.

The second BPR 74 occupies a greater space than the first BPR 48. Stated differently, the second BPR 74 is greater than or bigger than the first BPR 48. As a result, the first BPR 48 has a larger critical dimension (CD) than the second BPR 74.

The second BPR 74 is thus formed from a backside of the original wafer 10. It is noted that though only one level of the backside metal line layer 80 and the via 78 is illustrated here, a process can have more than one layer of backside metal line layer and via levels.

Figure 15:
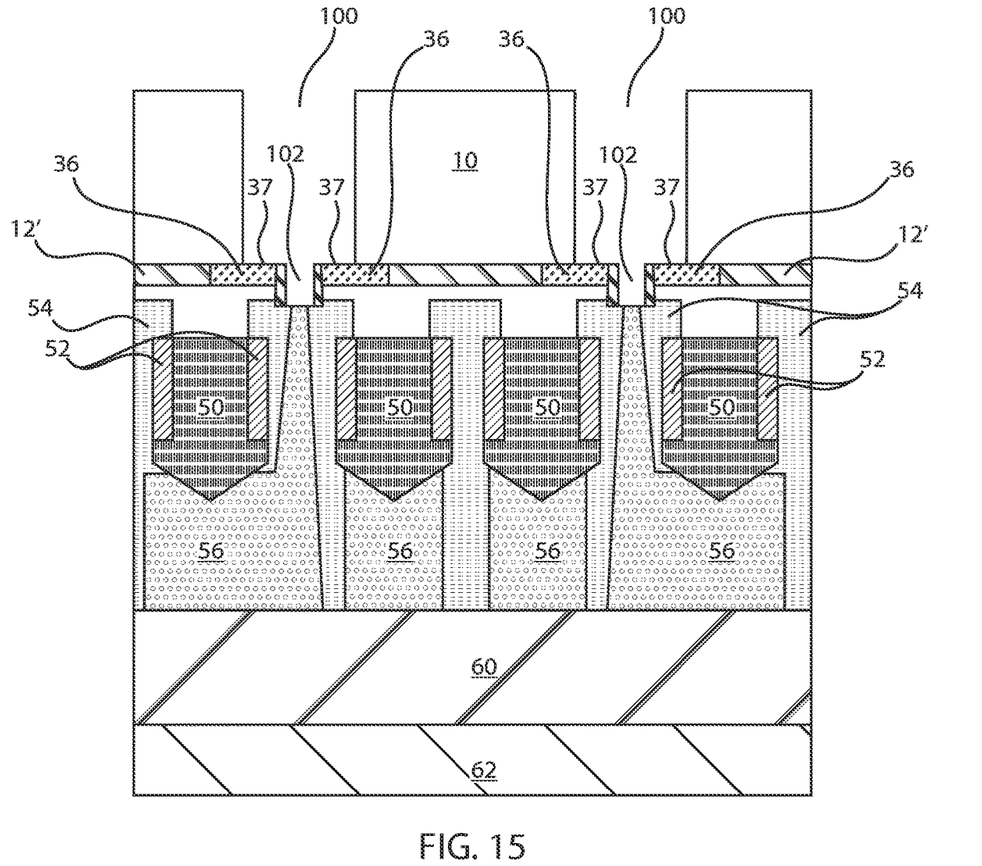
FIG. 15 is a cross-sectional view of the semiconductor structure of FIG. 13 where the first BPR is completely removed, in accordance with another embodiment of the present invention.

FIG. 15 is a cross-sectional view of the semiconductor structure of FIG. 13 where the first BPR is completely removed, in accordance with another embodiment of the present invention.

In another example embodiment, after FIG. 13, where the top section 70 of the BPR 48 is exposed, the entire BPR 48 is removed to create opening 102. Thus, a top surface of the via 58 is exposed. The openings within the substrate 10 are designated as 100.

Figure 16:
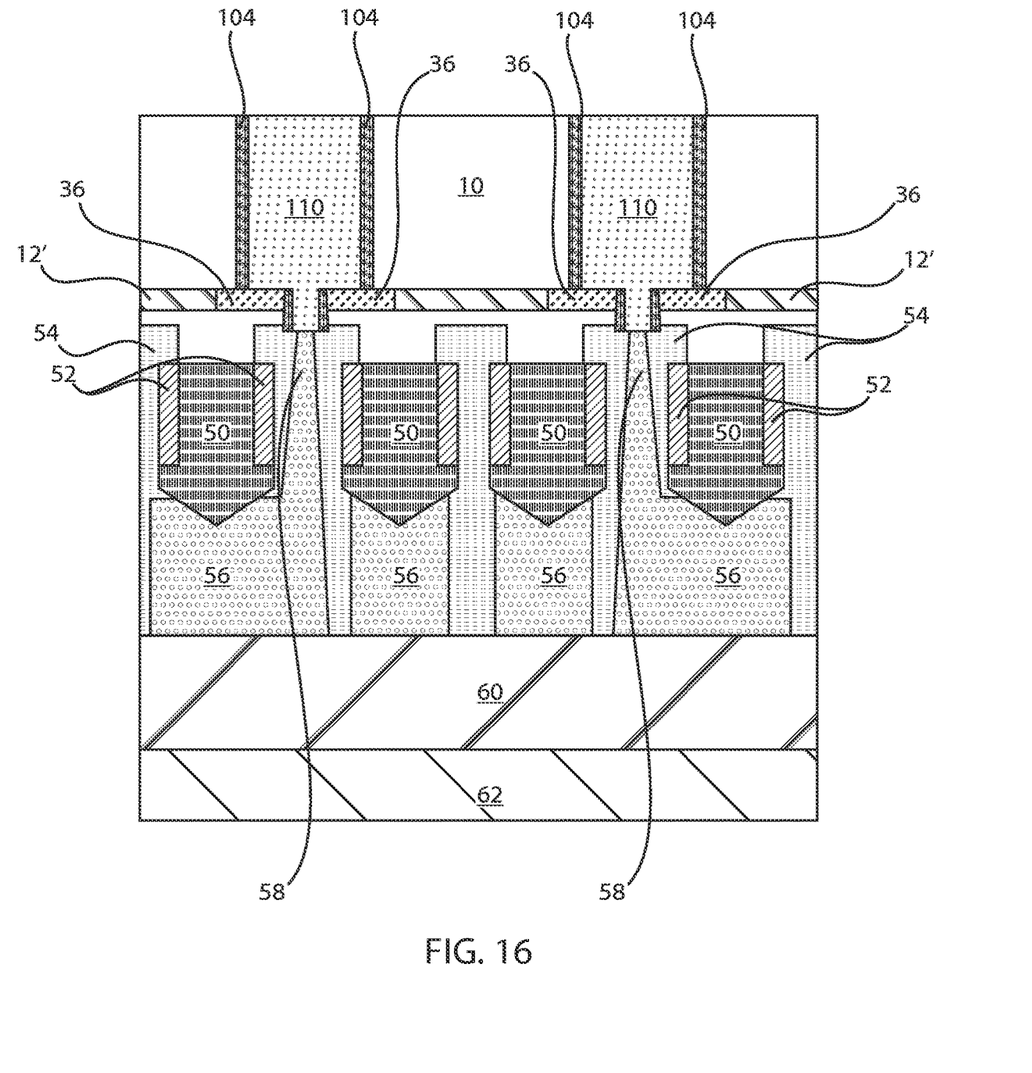
FIG. 16 is a cross-sectional view of the semiconductor structure of FIG. 15 where a single BPR is deposited, in accordance with an embodiment of the present invention.

FIG. 16 is a cross-sectional view of the semiconductor structure of FIG. 15 where a single BPR is deposited, in accordance with an embodiment of the present invention.

In various example embodiments, a dielectric liner 104 and a single BPR 110 is deposited. The single BPR 110 directly contacts a top surface of the via 58.

The dielectric liner 104 and the single BPR 110 can be planarized by, e.g., chemical mechanical planarization (CMP).

Therefore, the first BPR 48 is a sacrificial BPR that can include, e.g., TiO$_2$ or AlOx. The single BPR 110 defines an upper portion and a lower portion. The lower portion of the BPR 110 has a larger critical dimension (CD) than the upper portion of the BPR 110. The lower portion of the BPR 110 directly contacts the bottom surface of the inner spacers 36.

In this alternative embodiment, the BPR 110 is also formed from the backside of the wafer.

Non-limiting examples of suitable conductive materials for the BPR 110 include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further comprise dopants that are incorporated during or after deposition. The conductive metal can be deposited by a suitable deposition process, for example, CVD, PECVD, PVD, plating, thermal or e-beam evaporation, and sputtering.

In summary, the exemplary embodiments of the present invention disclose a semiconductor device including a two-staged BPR, where the upper stage is connected to a source/drain region through the VBPR contact and the lower stage is connected to a backside power delivery network (BSPDN) through a backside nano through-Si-via (nTSV). The lower stage BPR has a larger critical dimension (CD) than the upper BPR and the lower stage BPR is stopped over a dielectric etch stop layer. The method includes forming a two-stage buried power rail, where the bottom portion of the two-stage BPR includes a sacrificial material, below an etch stop layer in the substrate, and the top portion of the two-stage BPR includes a dielectric liner and metal, forming a FEOL device with vias connecting S/D regions to the top stage of the BPR, forming BEOL components and a carrier wafer, flipping the wafer and thinning down the substrate, removing the sacrificial material in the bottom portion of the BPR, enlarging the size of the bottom portion of the BPR stopping over the etch stop layer, and performing metallization on the bottom portion of the BPR. As a result, the BPR is formed from a backside of the carrier wafer (and is thus not formed early in the FEOL).

Regarding FIGS. 1-16, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of methods and devices for forming a buried power rail at a tight cell-to-cell space (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device comprising:
   a first buried power rail (BPR) disposed through an etch stop layer;
   a second BPR disposed in direct contact with the first BPR, wherein the second BPR has a larger critical dimension (CD) than the first BPR; and
   dielectric sidewall spacer disposed between the first BPR and the etch stop layer.

2. The semiconductor device of claim 1, wherein the etch stop layer directly contact the dielectric sidewall spacer sidewalls.

3. The semiconductor device of claim 1, wherein a bottom surface of the first BPR directly contacts a via-to buried power rail (VBPR) contact.

4. The semiconductor device of claim 3, wherein source/drain contacts (CA) are disposed adjacent the VBPR contact and source/drain regions collectively defining middle-of-line (MOL) components.

5. The semiconductor device of claim 4, wherein back-end-of-line (BEOL) components are placed adjacent the MOL components.

6. The semiconductor device of claim 5, wherein a carrier wafer is disposed adjacent the MOL components and the BEOL components.

7. The semiconductor device of claim 6, wherein the second BPR is positioned on the carrier wafer.

8. The semiconductor device of claim 1, wherein the second BPR directly contacts top surfaces of the etch stop layers layer.

9. The semiconductor device of claim 1, wherein the second BPR occupies a greater space than the first BPR.

10. A semiconductor device comprising:
    source/drain contacts (CA) disposed adjacent via-to buried power rail (VBPR) contacts and source/drain regions collectively defining middle-of-line (MOL) components;
    a buried power rail (BPR) disposed through an etch stop layer such that the BPR directly contacts a VBPR contact of the VBPR contacts; and
    dielectric sidewall spacer disposed between the BPR and the etch stop layer.

11. The semiconductor device of claim 10, wherein an upper portion of the BPR has a larger critical dimension (CD) than a lower portion of the BPR.

12. The semiconductor device of claim 10, wherein back-end-of-line (BEOL) components are placed adjacent the MOL components.

13. The semiconductor device of claim 12, wherein a carrier wafer is disposed adjacent the MOL components and the BEOL components.

14. The semiconductor device of claim 13, wherein the BPR is positioned on the carrier wafer.

* * * * *